US008946061B2

(12) United States Patent
Darby et al.

(10) Patent No.: US 8,946,061 B2
(45) Date of Patent: Feb. 3, 2015

(54) ENGINEERING OF POROUS COATINGS FORMED BY ION-ASSISTED DIRECT DEPOSITION

(75) Inventors: Blake Darby, Gainesville, FL (US); Ludovic Godet, Boston, MA (US); Xianfeng Lu, Chandler, AZ (US)

(73) Assignee: Varian Semiconductor Equiptment Associates, Inc., Gloucester, MA (US)

( * ) Notice: Subject to any disclaimer, the term of this patent is extended or adjusted under 35 U.S.C. 154(b) by 0 days.

(21) Appl. No.: 13/597,146

(22) Filed: Aug. 28, 2012

(65) Prior Publication Data
US 2013/0052810 A1    Feb. 28, 2013

Related U.S. Application Data

(60) Provisional application No. 61/528,933, filed on Aug. 30, 2011.

(51) Int. Cl.
H01L 21/00 (2006.01)
C23C 16/24 (2006.01)
C23C 16/28 (2006.01)
C23C 16/452 (2006.01)
H01M 4/04 (2006.01)
H01M 4/1395 (2010.01)

(52) U.S. Cl.
CPC ............ *C23C 16/24* (2013.01); *C23C 16/28* (2013.01); *C23C 16/452* (2013.01); *H01M 4/0421* (2013.01); *H01M 4/1395* (2013.01); Y02E 60/122 (2013.01)
USPC ........................................ 438/479; 438/485

(58) Field of Classification Search
USPC .................................................. 438/479–485
See application file for complete search history.

(56) References Cited

U.S. PATENT DOCUMENTS

| 5,591,653 | A  | * | 1/1997 | Sameshima et al. | ......... 438/166 |
| 7,176,111 | B2 | * | 2/2007 | Baert et al. | .................... 438/479 |
| 2012/0289030 | A1 | | 11/2012 | Godet et al. | |

FOREIGN PATENT DOCUMENTS

WO    0074932 A1    12/2000

OTHER PUBLICATIONS

Bae, Sanghoon, et al., Characteristics of Amorphous and Polycrystalline Silicon Films Deposited at 120 DEG C by Electron Cyclotron Resonance Plasma-Enhanced Chemical Vapor Deposition, Journal of Vacuum Science and Technology Part A, May 1, 1998, pp. 1912-1916, vol. 16, No. 3, American Vacuum Society, Research Triangle Park, North Carolina, United States.

Shin, H-C, et al., Porous Silicon-Based Electrodes for Lithium Batteries, Proceedings of the Electrochemical Society, Oct. 20, 2002, pp. 518-525, vol. 2002-26.

* cited by examiner

*Primary Examiner* — Richard Booth

(57) ABSTRACT

In one embodiment, a method of producing a porous semiconductor film on a workpiece includes generating semiconductor precursor ions that comprise one or more of: germanium precursor ions and silicon precursor ions in a plasma of a plasma chamber, in which the semiconductor precursor ions are operative to form a porous film on the workpiece. The method further includes directing the semiconductor precursor ions to the workpiece over a range of angles.

13 Claims, 10 Drawing Sheets

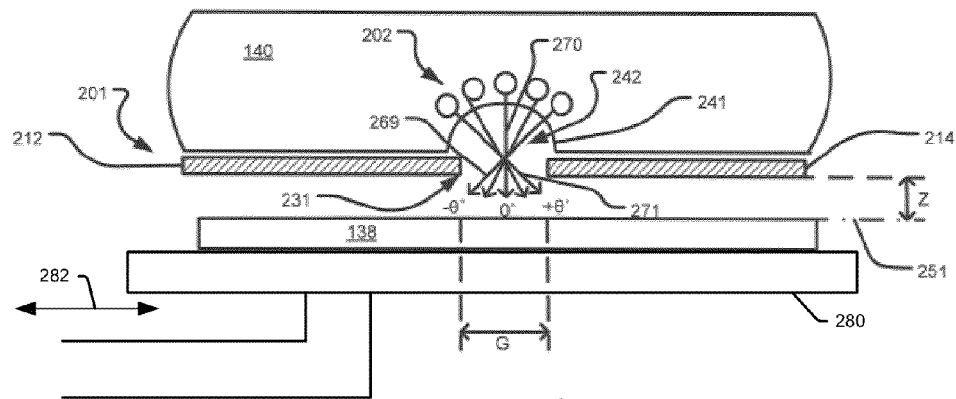
FIG. 5b
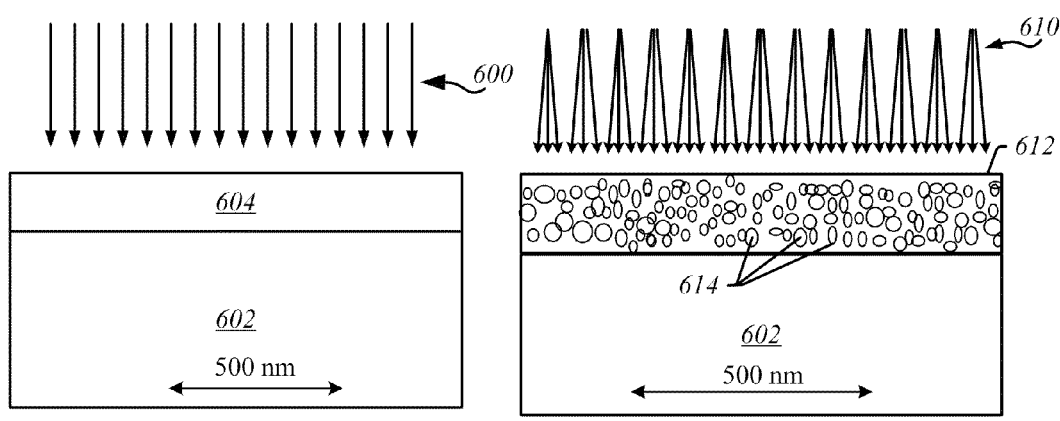
FIG. 6a
FIG. 6b

ENGINEERING OF POROUS COATINGS FORMED BY ION-ASSISTED DIRECT DEPOSITION

This application claims priority to U.S. provisional patent application No. 61/528,933, filed Aug. 30, 2011 and incorporated by reference herein in its entirety.

FIELD

This invention relates to fabrication of porous coatings, and more particularly, to deposition of porous coatings for batteries.

BACKGROUND

Graphitized carbon is currently the anode of choice for commercial Li-ion batteries due to its stable cycling behavior and low cost. However, a disadvantage of using carbon as a battery material is its inherently low theoretical charging capacity of 372 mAh/g. In particular, FIG. 1 shows a chart of charging capacities expressed as volumetric (mAh/l) and gravimetric (mAh/g) values for a variety of materials. As can be seen from the chart, alternative materials such as silicon (Si) and germanium (Ge) have much higher charging capacities than carbon, affording the potential to make lithium ion batteries based upon Si or Ge materials that are significantly lighter and longer lasting than carbon-based batteries. Although Si exhibits the highest known charging capacity of any anode material at 4200 mAh/g, germanium, either in pure form or as a component of a SiGe alloy, is also a promising candidate for lithium ion batteries for several reasons. For example, germanium has the second highest theoretical gravimetric charging capacity of any anode material at 1625 mAh/g. Germanium also has a higher electrical conductivity than Si, which facilitates a faster rate of electron transfer to a current collector in a battery. Moreover, the lithium diffusion coefficient for Ge is 400 times greater than Si at room temperature. Both of these properties are important for high rate applications, since the electrochemical reaction (see Eq. 1) that takes place in lithium ion batteries is limited by electron and lithium ion transport.

$$Li_{4.4}Si \leftrightarrow 4.4Li^+ + Si + 4.4e^- \qquad (1)$$

In addition, unlike Si, Ge does not form a stable oxide. In particular, the native oxide layer that may be formed on a silicon surface not only consumes some of the active anode material (Si), but also acts as a diffusion barrier to Li ions. Accordingly, anode materials based at least in part of Ge may have superior performance due to less anode consumption and higher lithium ion diffusion rates. Moreover, although Ge forms the same $Li_{22}X_5$ phase as Si during battery charging, Ge exhibits a lower volumetric expansion (270%) during this process, which results in more stable cycling and less capacity fade after a given number of charging cycles. Ge is also completely miscible with Si, so that Si and Ge can be combined in any ratio to form a stable alloy. This property makes it possible to mix Si and Ge to form a SiGe alloy of any desired composition to take advantage of the high theoretical capacity of Si on the one hand and the beneficial kinetic properties of Ge on the other hand.

While Si and Ge are attractive as anode candidates in lithium ion batteries based upon their charging capacities, conventional thin film Si and Ge anodes suffer from physical integrity issues, such as pulverization, which may result from repeated cycling through charging and discharging processes. FIG. 2a depicts a charging process of an anode material, such as Si. When the anode 20 is charged, lithium ions 22 flow from the 24 cathode and into the anode 20. After charging, the lithium ions 22 may form a $Li_{22}Si_5$ phase, as illustrated in FIG. 2b. At the stage illustrated in FIG. 2b, the creation of this $Li_{22}Si_5$ phase causes the Si to expand up to 400%. Upon discharge (shown at its beginning stages in FIG. 2b), the lithium ions diffuse out of the anode 20, which may result in the disappearance of the $Li_{22}Si_5$ phase and cause the remaining Si atoms to contract back to a smaller volume and reconstitute in a Si phase. This process of $Li_{22}Si_5$ phase formation and destruction, together with the concomitant expansion and contraction of the anode layer from the phase changes typically causes the anode to separate from the current collector over time, resulting in a drop in charging capacity.

FIG. 3 shows a microstructure of a thin film Si anode portion 30 after being subjected to repeated charging/discharging cycles. The microstructure depicted in FIG. 3 is based upon a low magnification secondary electron microscope (SEM) image of a thin film Si anode portion 30. As is evident, the lithiation process, in which lithium diffuses into the silicon anode during charging and diffuses out of the silicon anode during discharge, induces sufficient stress to cause the film to segregate into Si islands 32, which eventually may separate completely from the substrate 34. High cycling rates also increase the rate of delamination of the deposited film. Moreover, although the volumetric expansion is less for germanium, thin films of Ge when used as lithium ion battery anode suffer from the same failure mechanism. In this manner, capacity fade due to delamination is typical for lithium ion battery structures made using Si or Ge thin films as anodes.

Accordingly, before Si and Ge can be integrated into commercial lithium ion battery technology, the problem of capacity fade should be addressed. Recently, several researchers have tested anodically etched porous Si as an anode material, with promising results. The porous microstructure of the silicon is believed to provide room for expansion and contraction that occurs during respective charging and discharging steps, which may help the silicon to maintain contact with the current collector after repeated cycling.

Porous silicon is a material that has received increased attention especially due to its excellent properties in energy storage application. However, in spite of extensive study for over 30 years, there has been little improvement in the fabrication technique for porous silicon since its invention. The anodization process is typically expensive and complex, thereby making anodized porous silicon less attractive for high volume applications such as lithium ion batteries. Therefore, it will be apparent that improved apparatus and methods are desirable.

BRIEF SUMMARY

Various embodiments involve producing porous semiconductor coatings. In one embodiment, a method of producing a porous semiconductor film on a workpiece includes generating semiconductor precursor ions that include one or more of: germanium precursor ions and silicon precursor ions in a plasma of a plasma chamber, in which the semiconductor precursor ions are operative to form a porous film on the workpiece. The method further includes directing the semiconductor precursor ions to the workpiece over a range of angles.

In another embodiment, a method for forming a battery is provided. The method includes providing a metallic workpiece in a processing system and generating a plasma in a plasma chamber of the processing system proximate the workpiece. The plasma contains a dilutant species, and further contains semiconductor precursor ions that include one or more of: germanium precursor ions and silicon precursor ions, in which the semiconductor precursor ions are operative to form a porous film on the workpiece. The method also includes providing an extraction plate intermediate the plasma and workpiece, where the extraction plate defines an aperture, wherein a shape of a plasma sheath boundary proximate the aperture is convex relative to the surface of the workpiece. The method also includes directing the semiconductor precursor ions from the plasma through the extraction plate and toward the workpiece over a range of angles.

BRIEF DESCRIPTION OF THE DRAWINGS

For a better understanding of the present disclosure, reference is made to the accompanying drawings, which are incorporated herein by reference and in which:

FIG. 2b depicts a discharging process for the silicon anode of FIG. 2a;

FIG. 5b depicts is a cross-section view of an embodiment of sheath modification;

FIGS. 6a and 6b depict, respectively, a silicon film structure formed using a conventional deposition process and a silicon film structure formed using a deposition process consistent with the present embodiments;

DETAILED DESCRIPTION

Figure 1:
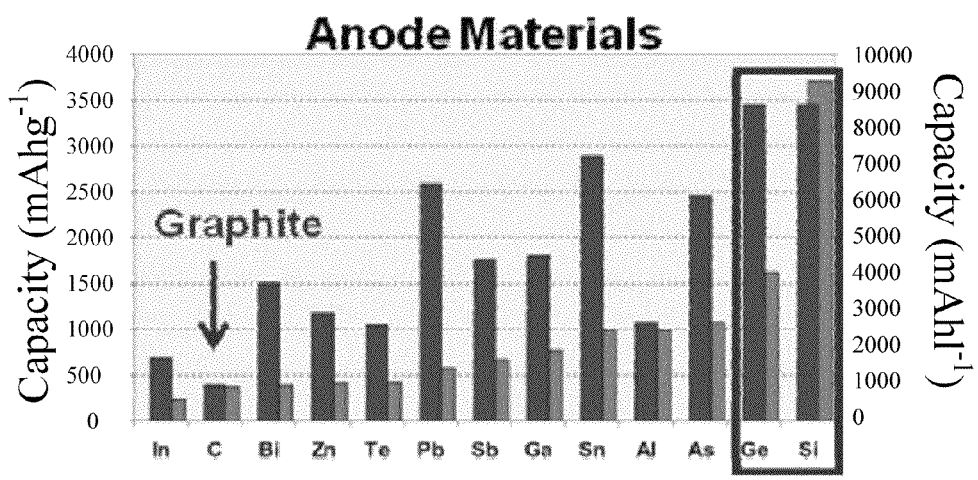
FIG. 1 presents charging capacity data for a variety of anode materials.
Figure 2A:
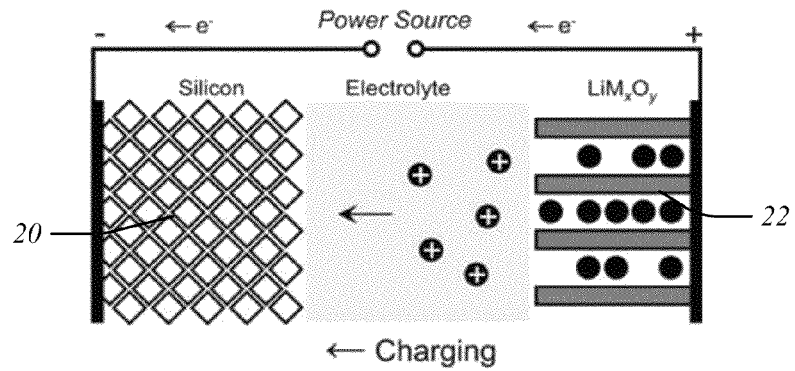
FIG. 2a depicts schematically a battery charging process using lithium ions to charge a silicon anode.
Figure 2B:
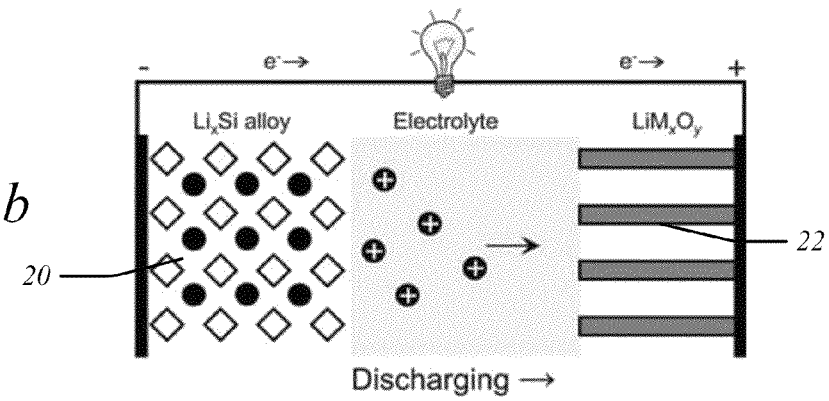
Figure 3:
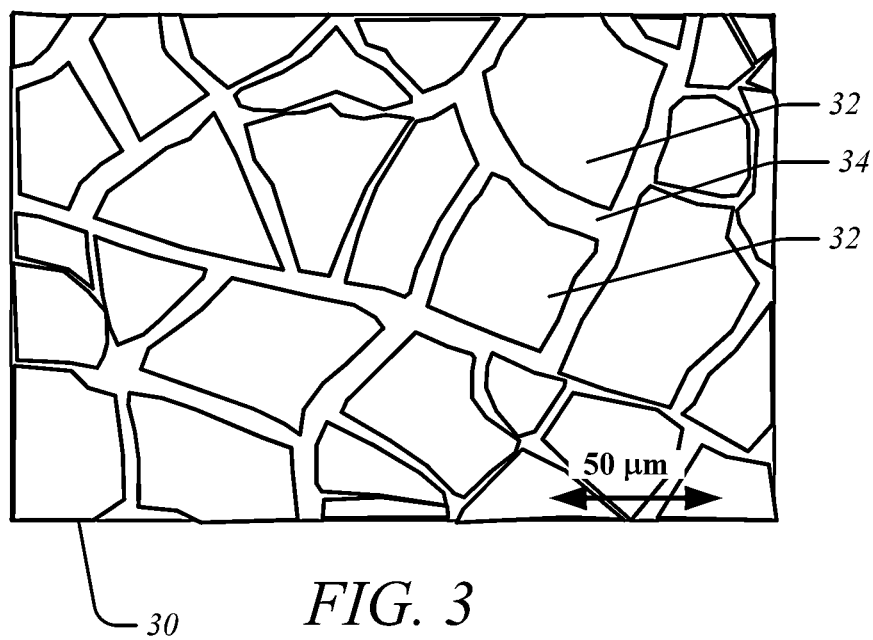
FIG. 3 depicts a microscopic view of a thin film silicon anode after multiple charging/discharging cycles.

The present embodiments are generally directed toward novel methods and systems for creating porous coatings, including porous semiconductor coatings, and more particularly porous Si, porous Ge, porous SiGe alloys, and doped variants of the porous Si, Ge, and SiGe alloys. In particular, the present embodiments are related to providing such porous materials with high charging capacities and increased stability after multiple charging/discharging cycles. The creation of an effective and commercially viable process for forming porous silicon and related materials, including porous germanium and porous silicon germanium, is becoming increasingly important for at least the reasons discussed above. In addition, the ability to control various features in such materials, including pore size and porosity, may be important to successfully deploying such materials in technologies such as thin film lithium ion batteries. Disclosed herein is a novel method of forming porous silicon, silicon-germanium, and germanium materials using ion-assisted direct deposition. The term "ion-assisted direct deposition" as used herein refers to a process of depositing a film from ions that form on a workpiece to form the film. In various embodiments, a novel form of ion-assisted direct deposition involves directing ions to a workpiece over a range of angles to form the ions into a porous film structure. Although the detailed embodiments focus on Si—Ge materials, the novel method has applicability to forming porous coatings based on other materials, including other material systems that may be appropriate as anodes in thin film batteries. Such other materials include materials or combinations of those materials depicted in FIG. 1, and other materials not specifically listed in FIG. 1, as will be readily appreciated by those of ordinary skill in the art.

Figure 4:
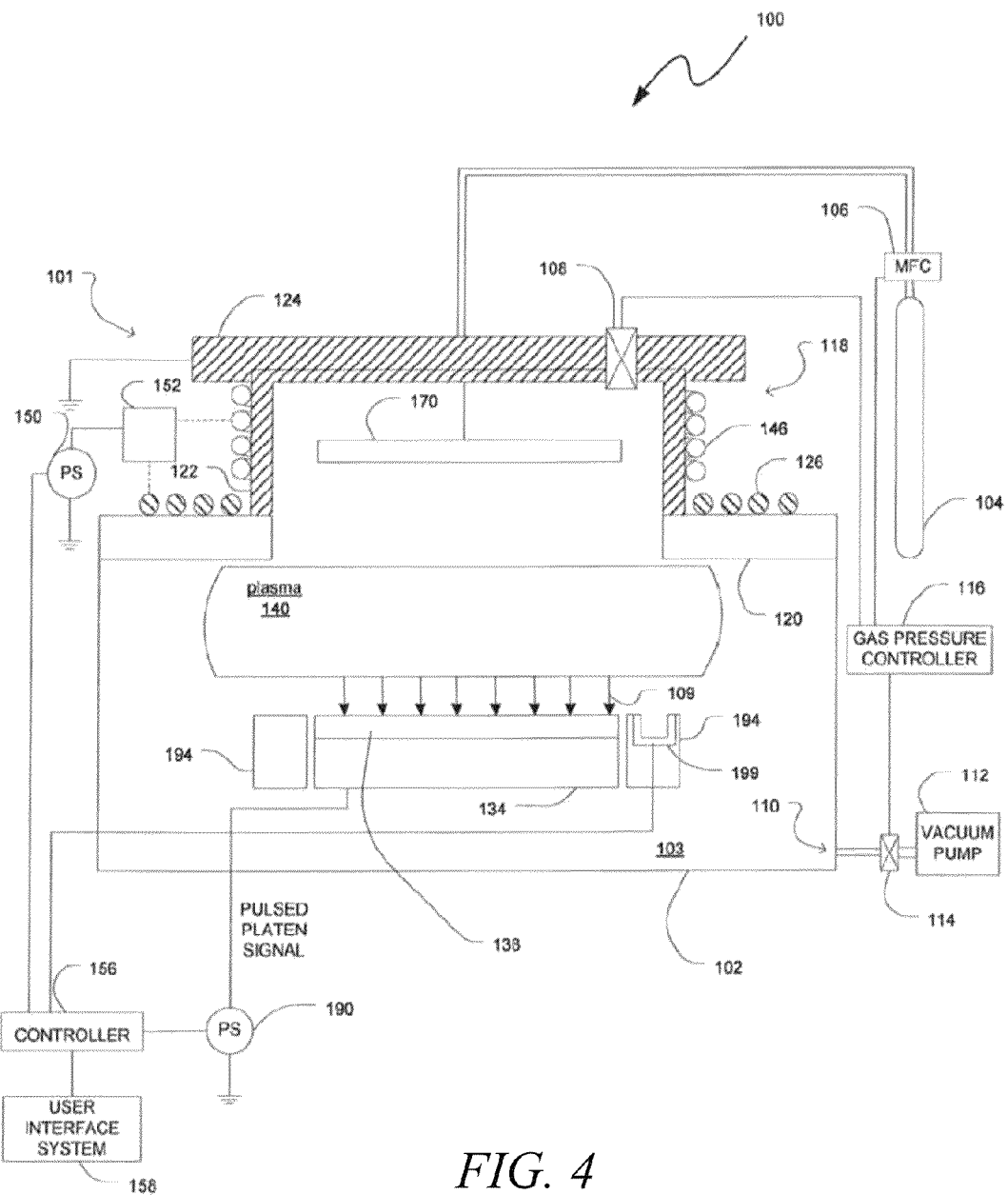
FIG. 4 depicts an exemplary processing system.

Film deposition for forming porous films (coatings) can be performed in a number of ways. Turning to FIG. 4, a block diagram of one exemplary plasma processing apparatus 100 is illustrated. The plasma processing apparatus 100 includes a process chamber 102 defining an enclosed volume 103. A gas source 104 provides a primary gas to the enclosed volume 103 of the process chamber 102 through the mass flow controller 106. A gas baffle 170 may be positioned in the process chamber 102 to deflect the flow of gas from the gas source 104. A pressure gauge 108 measures the pressure inside the process chamber 102. A vacuum pump 112 evacuates exhausts from the process chamber 102 through an exhaust port 110. An exhaust valve 114 controls the exhaust conductance through the exhaust port 110.

The plasma processing apparatus 100 may further include a gas pressure controller 116 that is electrically connected to the mass flow controller 106, the pressure gauge 108, and the exhaust valve 114. The gas pressure controller 116 may be configured to maintain a desired pressure in the process chamber 102 by controlling either the exhaust conductance with the exhaust valve 114 or a process gas flow rate with the mass flow controller 106 in a feedback loop that is responsive to the pressure gauge 108. The process chamber 102 may have a chamber top 118 that includes a first section 120 formed of a dielectric material that extends in a generally horizontal direction. The chamber top 118 also includes a second section 122 formed of a dielectric material that extends a height from the first section 120 in a generally vertical direction. The chamber top 118 further includes a lid 124 formed of an electrically and thermally conductive material that extends across the second section 122 in a horizontal direction.

The plasma processing apparatus further includes a source 101 configured to generate a plasma 140 within the process chamber 102. The source 101 may include a RF source 150 such as a power supply to supply RF power to either one or both of the planar antenna 126 and the helical antenna 146 to generate the plasma 140. The RF source 150 may be coupled to the antennas 126, 146 by an impedance matching network 152 that matches the output impedance of the RF source 150 to the impedance of the RF antennas 126, 146 in order to maximize the power transferred from the RF source 150 to the RF antennas 126, 146.

The plasma processing apparatus may also include a bias power supply 190 electrically coupled to the platen 134. The plasma doping system may further include a controller 156 and a user interface system 158. The controller 156 can be or include a general-purpose computer or network of general-purpose computers that may be programmed to perform desired input/output functions. The controller 156 may also include communication devices, data storage devices, and software. The user interface system 158 may include devices such as touch screens, keyboards, user pointing devices, displays, printers, etc. to allow a user to input commands and/or data and/or to monitor the plasma doping apparatus via the controller 156. A shield ring 194 may be disposed around the platen 134 to improve the uniformity of implanted ion distribution near the edge of the workpiece 138. One or more Faraday sensors such as Faraday cup 199 may also be positioned in the shield ring 194 to sense ion beam current.

In operation, the gas source 104 supplies a primary gas containing a desired dopant for introduction to the workpiece 138. The source 101 is configured to generate the plasma 140 within the process chamber 102. The source 101 may be controlled by the controller 156. To generate the plasma 140, the RF source 150 resonates RF currents in at least one of the RF antennas 126, 146 to produce an oscillating magnetic field. The oscillating magnetic field induces RF currents into the process chamber 102. The RF currents in the process chamber 102 excite and ionize the primary dopant gas to generate the plasma 140.

The bias power supply 190 provides a platen signal to bias the platen 134 and hence the workpiece 138 to accelerate ions 109 from the plasma 140 towards the workpiece 138. The ions 109 may be positively charged ions and hence the ON periods of the platen signal may be negative voltage pulses with respect to the process chamber 102 to attract the positively charged ions. The amplitude of the platen signal may be selected to provide a desired energy.

To create porous silicon (P—Si), porous germanium (P—Ge), or porous silicon/germanium alloys (P—SiGe) via deposition, a reaction (reactive) gas, such as $SiH_4$, is introduced into the plasma processing chamber 102. In the embodiments described immediately below, the example of P—Si deposition is set forth in detail. However, similar procedures may be used to deposit P—SiGe P—Ge, as well as porous silicon (carbon) (P—Si(C)), as well as electronically doped variants of such materials. This may be accomplished by substitution of the appropriate reactive gas composition, as will be readily appreciated by those of ordinary skill in the art. The pressure within the chamber 102 is preferably maintained at very low pressure, for example, at a pressure ranging from about 1 mTorr to about 100 mTorr, preferably about 5 mTorr to about 30 mTorr. Porous silicon may be best fabricated by increasing the ionization rate of the reaction gas. The formation rate of ions derived from a semiconductor precursor species (termed "semiconductor precursor ions" herein) such as $SiH_4$ or $GeH_4$ may be altered by changing parameters such as RF power and gas concentration, among other factors. In one embodiment, the reaction gas, such as $SiH_4$, is diluted with molecular hydrogen or other dilutant species, such that the $SiH_4$ concentration is less than, for example, 5%. In some embodiments, RF power raging from about 1 kW to about 20 kW, preferably about 3 kW to about 5 kW, is used to ionize the reaction gas. The reaction gas ions thus formed, which may be various known ionized products of $SiH_4$ or other silicon containing reaction gas (termed "silicon precursor ions"), are configured to form a solid film that contains silicon material when the ions encounter a workpiece surface.

Porous germanium films may be fabricated using a similar procedure by forming germanium precursor ions from a reaction gas such as $GeH_4$ although the RF power range employed may differ from that used to deposit silicon as discussed below. In embodiments for fabricating SiGe alloy films, an appropriate RF power range may be used, which is some examples may be intermediated between that employed to deposit pure silicon films and that used to deposit pure germanium films.

While highly diluted reaction gas is used in some embodiments, in other embodiments, concentrations of $SiH_4$ up to about 90%, preferably up to about 80%, may be mixed with the dilutant species. In the present disclosure, the dilutant species (also termed "dilutant gas") may include at least one of hydrogen, nitrogen, helium, neon, argon, krypton, and xenon. Those of ordinary skill in the art will recognize other dilutant species may also be used. A second factor in the growth of porous silicon is the bias voltage applied by the bias power supply 190. For example, a strong bias voltage may cause the ions 109 to accelerate too quickly toward the workpiece 138, thereby damaging the workpiece 138 surface. Therefore, in accordance with some embodiments, the bias voltage at the beginning of the deposition may be relatively lower, such as about 500V. As the deposition thickness increases, the bias voltage may be ramped up to a relatively higher voltage to increase the deposition speed. In this way, damage to the workpiece 138 can be minimized, while providing sufficient throughput of workpieces 138. For example, in one embodiment, the bias voltage is maintained at 500V for one minute and then ramped to about 1 KV or higher for the remainder of the deposition process.

In addition to fabricating porous silicon through ion-assisted direct deposition, various characteristics of the porous silicon can be controlled and varied. For example, two important characteristics of porous silicon are porosity and pore size. These parameters are advantageously controlled by modification of certain operating conditions within the chamber 102. For example, greater porosity and pore size may be achieved by increasing the ratio of ions to neutral species. This ratio can be affected by varying the $SiH_4$ flux, $SiH_4$ concentration and RF power. For example, a 15% mixture of $SiH_4$ at 5 mTorr allowed the fabrication of a porous silicon structure with high porosity and a pore size less than 20 nm. The remainder of the mixture may be hydrogen, helium or neon. In other embodiments, the concentration of $SiH_4$ is varied, such as from 5-20%, to modify the pore size and porosity. Of course, other ratios or concentrations are possible.

In some embodiments, larger pore size and porosity can be achieved by increasing RF power, increasing $SiH_4$ concentration, or lowering pressure. In some embodiments, the ion angular distribution is used to control the pore distribution and the pore size. For example, normal incidence ions may not create porous silicon, while ions with an incident angle larger than approximately 5° may allow creation of porous silicon.

In various other embodiments, plasma sheath modification may be used to generate curved plasma sheath boundaries to control the angle of incidence of ions. This provides an advantage over conventional plasma processing system apparatus in which a plasma sheath proximate the workpiece is typically substantially parallel to the surface of the workpiece. In the conventional apparatus, ions are thus initially accelerated toward the workpiece substantially perpendicular to the surface of the workpiece. Depending upon the gas pressure in the processing chamber and ion energy the ions in the conventional apparatus may traverse the plasma sheath without sustaining any gas phase collisions. Accordingly, ions may strike the workpiece at perpendicular incidence or over a narrow angular range near perpendicular incidence in the conventional apparatus. In contrast, as is known, plasma sheath modification may generate a curvature to a plasma sheath proximate a workpiece that causes ions to accelerate toward the workpiece over a range of incident angles. Consistent with the present embodiments, by changing operating parameters in a system having a plasma sheath modifier, the incidence angles and/or distribution of incidence angles of depositing ions may be changed, and therefore, the pore size may be altered in coatings of P—Si, P—SiGe, or P—Ge, P—Si(C), and doped variants of such materials to name some examples.

Figure 5A:
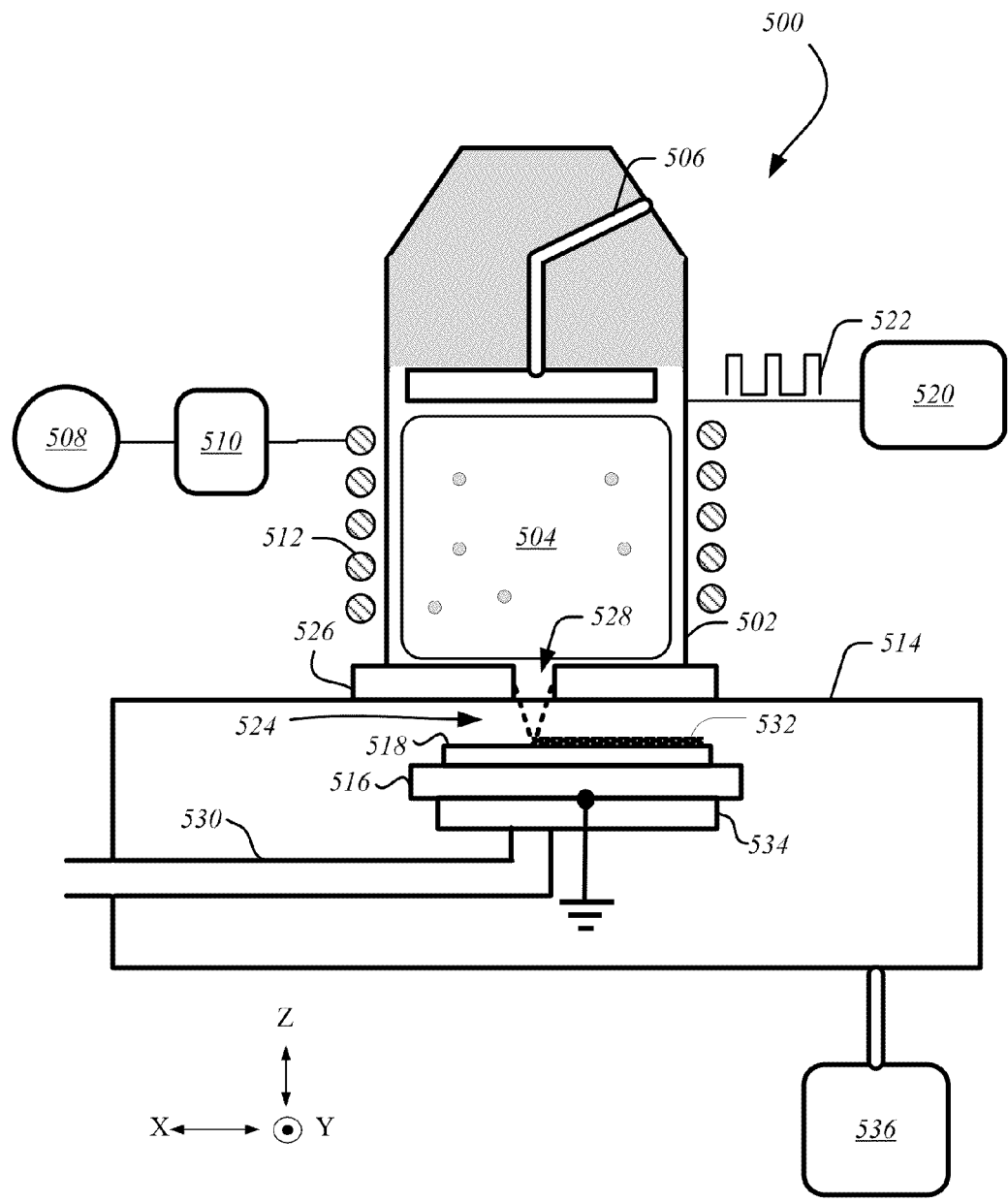
FIG. 5a depicts an exemplary processing system that employs sheath modification.

Consistent with further embodiments, FIG. 5a depicts an exemplary processing system 500 for performing ion-assisted direct deposition of porous semiconductor coatings. The processing system 500 includes a plasma chamber 502 in which a plasma 504 may be generated. A gas source 506 provides a source of gas that may be supplied to plasma chamber 502 to provide a source of gaseous species to form a plasma. A plasma source for the plasma 504 may, in various embodiments, be an in situ or remote, inductively coupled plasma source, capacitively coupled plasma source, helicon source, microwave source, or any other type of plasma source. In the specific embodiment depicted in FIG. 5a, a radio frequency (RF) generator 508 is coupled to a matching network 510 to provide an RF signal to coils 512. The RF signal in coils 512 may generate a radio-frequency plasma in plasma chamber 502, which plasma may be used to process a substrate (workpiece) as detailed below.

Processing system 500 also includes a process chamber 514 adjacent to and communicating with plasma chamber 502. The process chamber 514 includes a substrate holder 516, which may support a substrate 518 to be processed by ions derived from the plasma chamber 502. In various embodiments, the substrate holder 516 is movable with respect to the plasma chamber 502. In some embodiments, the substrate holder 516 may be movable along multiple different directions. For example, the substrate holder 516 may be movable along one or more of an X-direction, Y-direction, and Z-direction, which may be mutually orthogonal to one another as defined in the coordinate system of FIG. 5A. This allows different portions of the substrate 518 to be exposed to ions that exit the plasma chamber 502 and enter the process chamber 514.

In order to direct ions to the substrate 518, a bias may be applied between the substrate holder 516 and plasma chamber 502. In various embodiments, a continuous or pulsed bias having a desired voltage appropriate for a given process may be applied between the substrate holder 516 and plasma chamber 502. In the example shown in FIG. 5a, a bias source 520 may apply a pulsed bias signal 522 to the plasma chamber 502 while the substrate holder 516 is grounded. However, in other embodiments, a pulsed or continuous (negative) bias may be applied to the substrate holder 516, while the plasma chamber 502 is grounded. In the example shown in FIG. 5a, the pulsed bias signal 522 may comprise pulses of positive voltage alternating with periods where zero voltage is applied, resulting in (positive) ions 524 being directed toward the grounded substrate holder 516 during periods of positive voltage pulses. The ions 524 may thereby impinge upon substrate 518 resulting in direct deposition in regions of the substrate 518 that intercept the ions 524.

The processing system 500 includes a plasma sheath modifier (PSM) 526 adjacent to a portion of the plasma chamber 502 that is proximate the process chamber 514. In some embodiments, the PSM 526 may define a portion of the plasma chamber, a portion of the process chamber, or both. Consistent with the present embodiments, the PSM defines one or more apertures 528 that are used to direct the ions 524 to selected regions of the substrate 518. Although only illustrated in cross-section in the FIG. 5a, in plan view (x-y plane), the aperture 528 may assume any desired shape, such as a narrow slit, an oval, a circle, or a combination of shapes, to name a few examples. The PSM 526 may be multiple individual parts, or may be a single plate, for example. The PSM 526 acts to cause a local perturbation in the edge of a plasma sheath of plasma 504, as illustrated in more detail in an embodiment illustrated in FIG. 5b, for example. By doing so, the shape of plasma sheath proximate the aperture can be controlled in a manner that causes ions 524 to exit the plasma 504 and impinge on the substrate 518 over a range of angles. In some embodiments, the ions 524 may impinge upon the substrate 518 in a narrowing beam as illustrated. Additional description of general features of a processing system with a PSM can be found in co-pending U.S. patent application Ser. No. 12/417,929, filed Apr. 3, 2009, and issued as U.S. Pat. No. 7,767,977; Ser. No. 12/418,120, filed Apr. 3, 2010; Ser. No. 12/644,103, filed Dec. 22, 2009; and Ser. No. 12/848,354, filed Aug. 2, 2010, each of which is herein incorporated in its entirety by reference.

As further illustrated in FIG. 5a, the drive 530 may be engaged to move the substrate holder 516 along the X-direction, while the substrate 518 is exposed to ions 524 from the plasma 504. As depicted, along the X-direction, the size of aperture 528 is smaller than the size of substrate 518, and the ions 524 form a narrowing beam, resulting in exposure at any given instant of only a local region of the substrate 518 having a small dimension along the X-direction. Accordingly, processing of the substrate 518 may be confined to a narrow region along the X-direction at a given time. By translating the substrate holder 516 along the X-direction, multiple regions of the substrate 518 may be exposed ions 524. In some examples, the substrate holder 516 may move continuously along the X0-direction while ions 524 continuously impinge on the substrate 518, thereby exposing a large region of the substrate 518 to ions 524, such as an entire surface of the substrate 518. In the example of FIG. 5a, a single coating 532 may be formed on the substrate 518 by continuously scanning the substrate 518 while ions 524 are directed toward the substrate 518. Such a deposit may be formed by supplying ions 524 that are reactive species condensable on the substrate 518 under the appropriate experimental conditions, as detailed below. However, in other embodiments, in order to avoid processing of unwanted regions of substrate 518 by ions 524, the pulsed bias signal 522 may be extinguished when those unwanted regions are scanned under the aperture 528. The processing system 500 also may include a substrate heater 534, and one or more pumping system, such as pump system 536, whose operation is described further below.

FIG. 5b is a block diagram of a portion of a plasma processing apparatus having a plasma sheath modifier 201 that provides details of the geometry of the plasma sheath and ion trajectories. The plasma 140 is generated as is known in the art. This plasma 140 is generally a quasi-neutral collection of ions and electrons. The ions typically have a positive charge while the electrons have a negative charge. The plasma 140 may have an electric field of, for example, approximately 0 V/cm in the bulk of the plasma 140. In a system containing the plasma 140, ions 202 from the plasma 140 are attracted toward a workpiece 138. These ions 202 may be attracted with sufficient energy to be implanted into the workpiece 138. The plasma 140 is bounded by a region proximate the workpiece 138 referred to as a plasma sheath 242. The plasma sheath 242 is a region that has fewer electrons than the plasma 140. Hence, the differences between the negative and positive charges cause a sheath potential in the plasma sheath 242. The light emission from this plasma sheath 242 is less intense than the plasma 140 because fewer electrons are present and, hence, few excitation-relaxation collisions occur. Thus, the plasma sheath 242 is sometimes referred to as "dark space."

In various embodiments, the plasma sheath modifier 201 may be incorporated into a processing system such as the plasma processing system 100 and may be disposed generally proximate the plasma 140 on one side of plasma sheath modifier 201 and proximate workpiece 138 and workpiece holder 280 on the other side, as illustrated in FIG. 5b. Referring also to FIG. 4, in various embodiments, the plasma sheath modifier 201 may be disposed generally within region 188 either in a fixed manner or may be movable with respect to workpiece 138. Alternatively, in other embodiments, the plasma sheath modifier 201 may be an embodiment of the PSM 526 of the processing system 500 of FIG. 5a. The plasma sheath modifier 201 is configured to modify an electric field within the plasma sheath 242 to control a shape of a boundary 241 between the plasma 140 and the plasma sheath 242. Accordingly, ions 202 that are attracted from the plasma 140 across the plasma sheath 242 may strike the workpiece 138 at a large range of incident angles. This plasma sheath modifier 201 may be referred to as, for example, a focusing plate or sheath engineering plate.

In the embodiment of FIG. 5b, the plasma sheath modifier 201 includes a pair of panels 212 and 214 defining an aperture 231 there between having a horizontal spacing (G), also referred to herein as "aperture width." The panels 212 and 214 may be an insulator, semiconductor, or conductor. In other embodiments, the plasma sheath modifier 201 may include only one panel or more than two panels. The panels 212 and 214 may be a pair of sheets having a thin, flat shape. In other embodiments, the panels 212 and 214 may be other shapes such as tube-shaped, wedge-shaped, and/or have a beveled edge proximate the aperture 231. The panels 212 and 214 also may be positioned a vertical spacing (Z) above the plane 251 defined by the front surface of the workpiece 138. In one embodiment, the vertical spacing (Z) may be about 1.0 to 10.0 mm.

Ions 202 may be attracted from the plasma 140 across the plasma sheath 242 by different mechanisms. In one instance, the workpiece 138 is biased to attract ions 202 from the plasma 140 across the plasma sheath 242. In another instance, a plasma source that generates the plasma 140 and walls surrounding the plasma 140 are biased positively and the workpiece 138 may be grounded. The biasing may be pulsed in one particular embodiment. In yet another instance, electric or magnetic fields are used to attract ions 202 from the plasma 140 toward the workpiece 138.

Advantageously, the plasma sheath modifier 201 modifies the electric field within the plasma sheath 242 to control a shape of the boundary 241 between the plasma 140 and the plasma sheath 242. The boundary 241 between the plasma 140 and the plasma sheath 242 may have a convex shape relative to the plane 251 in one instance. When the workpiece 138 is biased, for example, the ions 202 are attracted across the plasma sheath 242 through the aperture 231 between the panels 212 and 214 at a large range of incident angles. For instance, ions 202 following trajectory path 271 may strike the workpiece 138 at an angle of +θ° relative to the plane 251. Ions 202 following trajectory path 270 may strike the workpiece 138 at about an angle of 0° relative to the same plane 251. Ions 202 following trajectory path 269 may strike the workpiece 138 an angle of −θ° relative to the plane 251. Accordingly, the range of incident angles may be between +θ° and −θ° centered about 0°. In addition, some ion trajectories paths such as paths 269 and 271 may cross each other. Depending on a number of factors including, but not limited to, the horizontal spacing (G) between the panels 212 and 214, the vertical spacing (Z) of the panels 212 and 214 above the plane 251, the dielectric constant of the panels 212 and 214, or other process parameters of the plasma 140, the range of incident angles (θ) may be between +60° and −60° centered about 0°.

As a result of being able to provide ions over a wide angular range using plasma sheath modifier 201, various embodiments provide numerous advantages for growing porous films. For one, porous films may be formed directly during film growth without having to perform post-deposition processing. In addition, porous films may be deposited at relatively lower temperatures, such as on unheated substrates, which is not possible using conventional plasma enhanced chemical vapor deposition (PECVD) in which elevated temperatures are required to deposit a layer. The degree of crystallinity of a porous film deposited according to the present embodiments may be controlled by altering the temperature applied to a workpiece during deposition and/or by post-deposition annealing of the workpiece. Other advantages include the ability to deposit porous films with a relatively uniform distribution of pores, and the ability to readily form porous films over a range of operating conditions, that is, the provision of a large process window(s) for forming porous films.

For example, referring again to FIG. 4, in the arrangement depicted therein in which a workpiece 138 is exposed directly to a plasma 140, in the absence of the plasma sheath modifier 201, the ability to deposit porous silicon, silicon/germanium or germanium films may be curtailed, as noted above. Because inert gas ions and ions of the reactive silicon or reactive germanium species are accelerated from plasma 140 in a generally orthogonal orientation to the top surface of workpiece 138, there may be little shadowing of species and the normal-incidence ions may tend to densify the growing deposit through knock on collisions. FIG. 6a depicts a scenario in which a silicon coating is deposited using a plasma processing apparatus having features similar to that depicted in FIG. 4 in the absence of a plasma sheath modifier 201. Accordingly, ions 600 are accelerated toward workpiece 602 at a normal incidence as shown. FIG. 6a also includes a cross-section view of a workpiece 602 based upon secondary electron microscopy (SEM) of the workpiece 602 after film deposition without the plasma sheath modifier 201. The perspective view includes a cross-section of a deposited coating 604. The deposited coating 604 is an amorphous silicon layer that does not exhibit any clear porosity. FIG. 6b depicts a similar perspective view illustrating the resulting structure of a silicon film deposited in the presence of a plasma sheath modifier 201. The FIG. 6b includes a schematic depiction of ions 610, which are incident on the workpiece 602 over a range of angles. In some embodiments, the range of angles may be centered about a perpendicular to a plane of the workpiece 602 (see plane 251 illustrated in FIG. 5b). FIG. 6b provides a cross-section the resultant deposited porous coating 612 based upon SEM analysis. In this case, pores 614 (on the scale of about 10 nm or greater) are clearly visible and appear to occupy a significant fraction of the porous coating 612.

In various other embodiments, the plasma processing system 100 may be employed with plasma sheath modifier 201 to deposit porous alloy films that comprise alloys of $Si_xGe_{1-x}$ where x ranges from 0 to 1. This may be accomplished, for example, by varying the gas composition of reactive gas precursors used as material sources for deposition of the alloys. In one example, precursor mixtures of $GeH_4$ and $SiH_4$ may be provided over a range of $SiH_4/GeH_4$ ratios from zero (no silane) to infinity (no germane). In various embodiments the percentage of total reactive gas ($SiH_4+GeH_4$) within the total gas ambient during deposition may vary, and in particular embodiments may be between about 5% and 95%, and more particularly may be between about 10% and 90%, and in some embodiments may be about 50%. The determination of gas composition may be made by either determining partial pressure or by relative flow rate of gas components in plasma processing system 100 according to different embodiments.

The relative composition of silicon and germanium in deposited films may also be modified by modifying the plasma operating parameters such as plasma power. It is known that the ionization efficiency of germane may be different than that of silane at any given power and may vary in a different manner than silane with changes in plasma power. Accordingly, changes in plasma power may be used to vary the composition of reactive species in a plasma for a given ratio of partial pressures of silane to germane. In this manner, the ratio of germanium precursor ions to silicon precursor ions directed toward the workpiece may be varied, and thereby the relative number of condensing germanium-containing species with respect to silicon-containing species may be altered by altering the plasma power. In embodiments of deposition of 100% porous silicon (P—Si) or 100% porous Ge (P—Ge), the partial pressure of silane or germane, as well as the plasma power may be tuned to optimize deposition. For example, optimal plasma power conditions for growing pure P—Si may be about 3 kW. Meanwhile the optimal plasma power conditions for growing pure P—Ge may be in the range of about 1 kW to 5 kW, preferably about 3 kW.

In some embodiments, a compositional gradient may be introduced into a growing p-SiGe deposit by dynamically changing deposition parameters during growth of the p-SiGe deposit. The change in parameters may result in a changing ratio of germanium precursor ions to silicon precursor ions incident on a workpiece as film deposition proceeds. For example, the plasma power may by dynamically varied during film growth, which may result in changing Si/Ge ratio as described above. In one example, a continuous variation in RF power during deposition may result in a continuously changing gradient in Si/Ge ratio through the deposited film thickness.

In another example, the ratio of germanium to silicon precursor ions may be varied by varying the relative ratio of silicon-containing gaseous precursors to germanium-containing gaseous precursors. In particular, the ratio of silane to germane gases may be dynamically altered during deposition, which, after ionization in the plasma, may alter the ratio of germanium precursor ions to silicon precursor ions directed toward the workpiece and thereby alter the Si/Ge ratio in a depositing film. In this manner, a first region (layer) of the depositing film close to the workpiece may be deposited that is relatively more silicon rich, while a second region located further from the workpiece may be relatively less silicon rich.

Figure 7A:
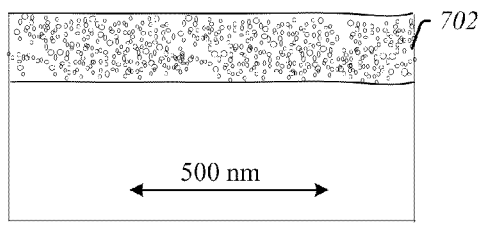
FIGS. 7a-7d depict film structure of porous silicon films deposited using apparatus consistent with the present embodiments, for four different diluting gases.
Figure 7B:
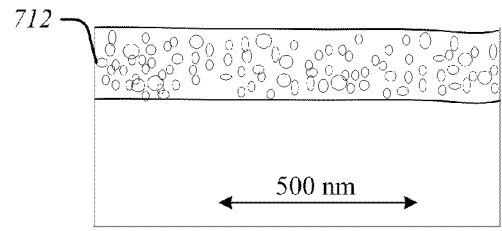
Figure 7C:
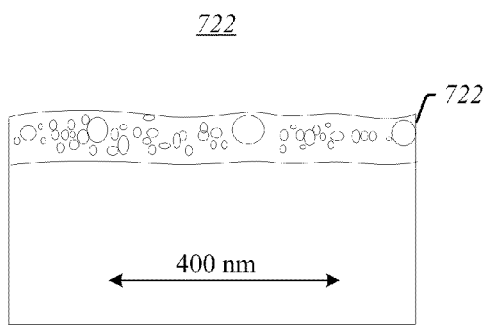
Figure 7D:
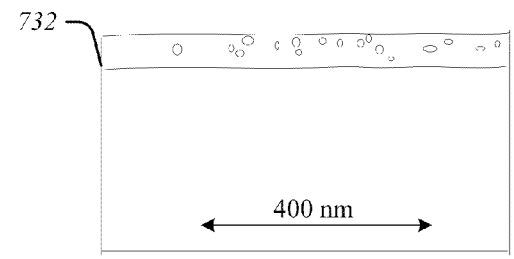

In various other embodiments, the porosity of deposited coatings may be controlled by controlling the type of diluting gas that is mixed with the precursor gas during film deposition. Gases such as $H_2$, He, Ne, and Ar may all be employed as diluting gases according to various embodiments. FIGS. 7a-7d are SEM images of perspective views including cross-sections of deposited P—Si films 702, 712, 722, and 732. In each case the ratio of diluting gas to silane was 1/1. As is evident, the pore size appears to increase with increasing mass of diluting gas between $H_2$ and Ne. For example, P—Si coating 702 in FIG. 7a is deposited using hydrogen as the diluting gas and exhibits relatively smaller pores, with a large fraction of pores 704 having a size on the order of 10 nm. The P—Si coating 712 shown in FIG. 7b is deposited using helium as diluting gas, and exhibits pores that appear to be larger than those in P—Si film 702, with a large fraction of pores 7'4 having a size between 15 nm and 40 nm. The pore size in P—Si film 722 of FIG. 7c, which was deposited using neon as diluting gas, is larger still. A large distribution of sizes of the pores 724 of P—Si film 722 is evident, with some pores as large as 50 nm. The porosity in P—Si film 732, deposited with Ar as diluting gas, is not as pronounced as that in the other films. In addition, the thickness of P—Si films 702 and 712, as well as their microstructure homogeneity, is greater than the thickness and homogeneity of P—Si films 722 and 732.

In various other embodiments, the pore size may be controlled by adjusting the angular distribution of ions provided during deposition of the P—Si, P—SiGe, or P—Ge layers. The angular distribution of ions, in turn, may be controlled by adjusting one or more of several different parameters. In one embodiment, the width of an aperture in a plasma sheath modifier may be changed to change the porosity of a deposited film. For example, referring again to FIG. 5b, when the aperture width G is varied, the shape of the boundary 241 may vary, which leads to a variation in the distribution of angles of incidence of ions 202. In embodiments in which the ions 202 include silicon and/or germanium precursor ions, this change in the distribution of angles of incidence of the ions changes the distribution of trajectories of depositing ions, thereby altering the geometry of film growth. For example, the degree of shadowing of incident ions in general varies with the angle of incidence. Accordingly, by increasing the aperture width G, P—Si films may be produced having a smaller pore size and a higher overall porosity as compared to P—Si films deposited using a smaller aperture width G. Similarly, the pore size and porosity in deposited P—Si films may be varied by changing the gas pressure, gas flux, and RF plasma power in a plasma processing system.

The precise management of available parameters to control pore size afforded by apparatus and methods of the present embodiments also facilitates the tailoring of porosity as a function of film thickness. For example, the porosity and pore size can be engineered so that porosity is lower at an interface between the deposited porous film and a metallic workpiece surface that serves as a collector in a completed battery. This may promote better adhesion of the porous film and underlying metallic surface. The porosity may be increased in portions of the deposited film that are located further from the underlying metal interface. This increased porosity near the film surface may help relive strain in the deposited film that may arise during the lithiation process that occurs from charging/discharging of a battery as described hereinabove.

In one example, a first gas dilutant mixture that has a relatively lower atomic mass, such as hydrogen, or a mixture of hydrogen and helium, may be supplied to a plasma chamber for a first period during an initial stage of film growth to generate small pores for regions of the film proximate the interface with the workpiece. This may be effective in promoting better adhesion. Subsequently, a second dilutant gas mixture that has a relatively higher atomic mass, such as neon, may be supplied during a later stage of film growth to create larger pores.

As will be appreciated by those of skill in the art, the optimum microstructure for creating adhesion at a substrate interface may depend both upon the overall porosity and the pore size. Accordingly, the exact recipe for varying dilutant gas mixture and aperture width for creating a stronger interface, as well as for creating a porous film remote from the interface that has improved diffusivity and less capacity fade may be determined in a heuristic manner.

In further embodiments, a system such as plasma processing system 100, may produce porous doped films. Such films may exhibit superior properties that are relevant to thin film battery anodes, among other applications. Recently, it has been demonstrated that capacity fade can be reduced for thin film anodes by introducing dopant atoms in the thin film layer. The improvement in capacity retention is attributed to the increase in conductivity of the amorphous film. In some embodiments, the incorporation of dopant atoms within P—Si, P—Ge, and P—SiGe layers may be accomplished by introducing an appropriate p-type or n-type dopant during deposition of the porous film. In some embodiments, to provide p-type or n-type doping to a depositing porous film, a small flow of respective $BF_3$ or $PH_3$ gases may be introduced into process chamber 102 together with the desired precursor gas, such as a combination of $SiH_4$ and/or $GeH_4$. In particular embodiments, the flow rate of dopant gases may be changed during the deposition process to form the doped porous film. In this manner the conductivity may be varied through the film's thickness. For example, the interface region between an underlying metal and P—Si, P—SiGe or P—Ge film could be highly doped in order to reduce contact resistance between the underlying metal and the deposited film, while portions of the deposited film nearer the film surface may be less highly doped as desired. This type of structure may be fabricated by providing a flow of dopant gas at a first, higher rate for a first duration during initial growth of a porous semiconductor film, followed by flow of the dopant gas at a second, lower rate for a second duration during subsequent growth of the porous semiconductor film. In other embodiments, the flow of dopant gas may be ramped during the growth of the porous semiconductor film for at least part of the duration of growth.

In additional embodiments, a P—S(C) film may be produced using a plasma sheath modifier system by introducing a silicon-containing precursor gas as well as an appropriate carbon-containing precursor gas as known in the art. Furthermore, p-type and n-type dopants ma be introduced into P—S (C) films by introducing an appropriate p-type or n-type dopant during film deposition.

Figure 8:
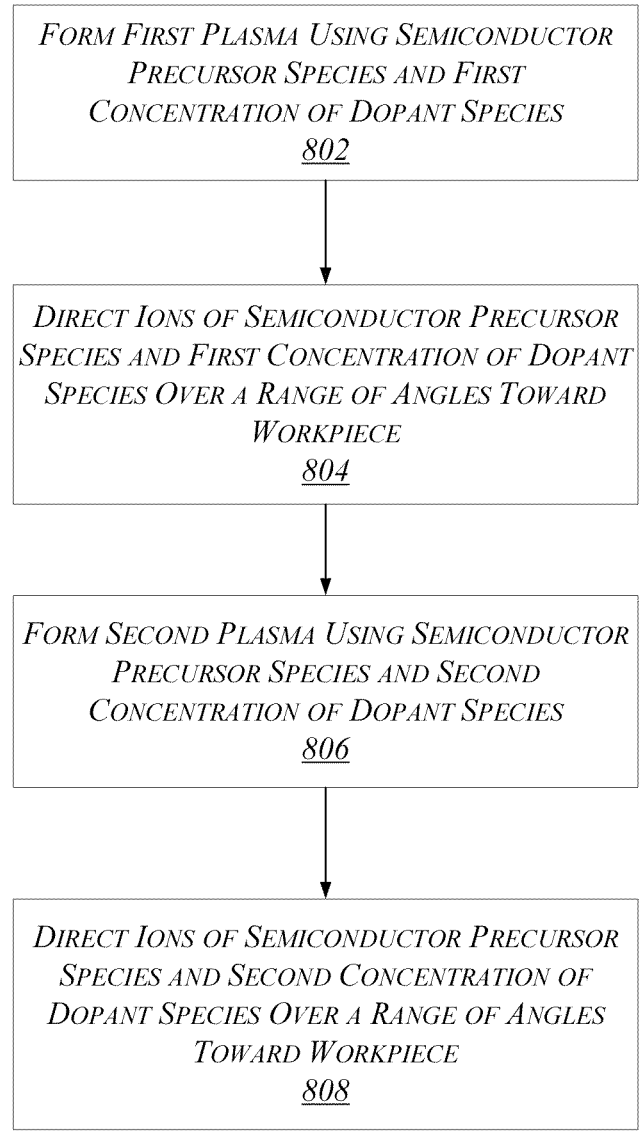
FIG. 8 depicts a process flow consistent with an embodiment of the disclosure.

FIG. 8 depicts an exemplary process flow 800 consistent with the present embodiments. At block 802 a first plasma is formed that contains precursor species and a first concentration of dopant species for depositing a porous film. In some embodiments, the first plasma may be formed using any desired combination of partial pressures of silane and/or germane and/or a carbon-containing precursor together with an appropriate partial pressure of a p-type dopant precursor such as $BF_3$ or n-type dopant precursor such as $PH_3$. The first plasma may additionally include diluting gases such as inert gases or hydrogen. At block 804 ions of the precursor species (for example, germanium precursor ions or silicon precursor ions) and ions of the first concentration of dopant species are directed to a workpiece over a range of angles. In this manner, a first layer of a porous film having a desired dopant concentration may be formed. At block 806 a second plasma is formed using the precursor species and a second concentration of dopant species. In some embodiments, the composition of gases within the second plasma may be the same as that of the first plasma save for a difference in partial pressure of gas comprising the dopant species. For example, a first plasma may be created in a chamber having a 1/1 ratio of partial pressures of germane/silane, while the chamber also includes a partial pressure of helium that is equal to the total pressure of germane and silane. In addition, the chamber may include a partial pressure of $BF_3$ equivalent to about 0.3% of the total pressure in the chamber. Thus, the overall gas composition used to form the first plasma may be 25% silane, 25% germane, 50% helium and 0.3% $BF_3$. The second plasma, on the other hand, may comprise 25% silane, 25% germane, 50% helium and 0.05% $BF_3$. At block 808, ions of the precursor species and second concentration of dopant species are directed to the workpiece over a range of angles. The workpiece at block 808 may already include a first doped layer formed from the first plasma so that a second doped layer having a different dopant concentration than the first doped layer is formed on the outer surface of the first doped layer.

In various embodiments, the process flow of FIG. 8 may be modified. For example, the concentration of dopant gas supplied to a chamber may be varied in a continuous fashion while a plasma is ignited so that the concentration of dopant species incorporated into the deposited porous film may vary in a continuous fashion. In further embodiments, the dopant gas concentration may be varied in multiple steps during deposition of the porous film, may be varied continuously for a first deposition period and subsequently held constant for a second deposition period, or may be ramped up and subsequently ramped down. Other schedules for varying the dopant gas concentration during porous film deposition are possible as will be evident to those of ordinary skill in the art.

In alternative embodiments, ion implantation may be performed after porous film deposition in order to dope a porous film once it is deposited. The ion implantation process may allow for precise control of dopant levels as a function of film thickness because of the ability to precisely control ion energy and ion dose. In further embodiments, ion implantation may be employed to cause ion beam mixing between the metal underlayer and porous film, which may improve adhesion of the porous anode layer to the underlying metal layer during repeated charging/discharging cycles of a battery formed from the porous anode. The ions used for ion beam mixing may be inert or dopant species in different embodiments.

Figure 9:
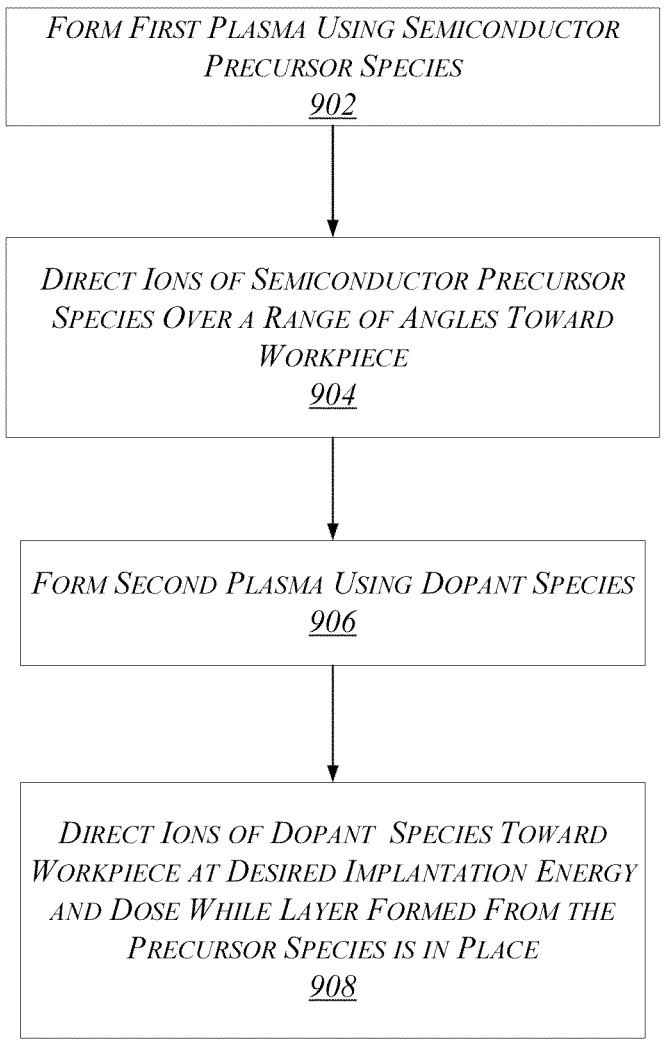
FIG. 9 depicts a process flow consistent with another embodiment.

In some embodiments, post-film deposition ion implantation may be performed using a conventional beam line ion implantation tool. In other embodiments, this ion implantation may be performed in-situ within the same processing apparatus used to deposit the porous film, such as plasma processing system 100. FIG. 9 depicts an exemplary process flow 900 consistent with the present embodiments. At block 902 a first plasma is formed that contains precursor species for depositing a film. In some embodiments, other ions such as inert gas ions or hydrogen ions may also be provided in the plasma. In various embodiments, the precursor species may be any combination of silane or germane. At block 904, ions formed from the precursor species are directed towards a workpiece over a range of angles. At least some of the ions may form a porous layer. At block 906, a second plasma is formed using dopant species such as $B_2H_6$ or $PH_3$. In various embodiments the first and second plasma may be formed in the same processing system, such as plasma processing system 100. At block 908, ions derived from the dopant species are directed towards the workpiece with the porous layer in place on the workpiece. In some embodiments, the dopant ions may be directed over a range of angles at the workpiece, while in other embodiments, the dopant ions may be provided at a normal angle of incidence to the workpiece.

In further embodiments, the surface area of deposited porous films may be controlled by varying plasma parameters during film deposition and/or by performing post-deposition treatment of the porous films. By controlling the surface area of a porous film used as a thin film anode, the diffusivity of lithium into and out of the anode may be varied. It is known that increasing the surface area drastically improves the performance of thin film anodes by enhancing lithium diffusivity, which may lead to faster charging and discharging of a battery.

In one example consistent with the present embodiments, the film deposition parameters during formation of P—Ge may be varied to increase the surface area of the P—Ge film.

Figure 10A:
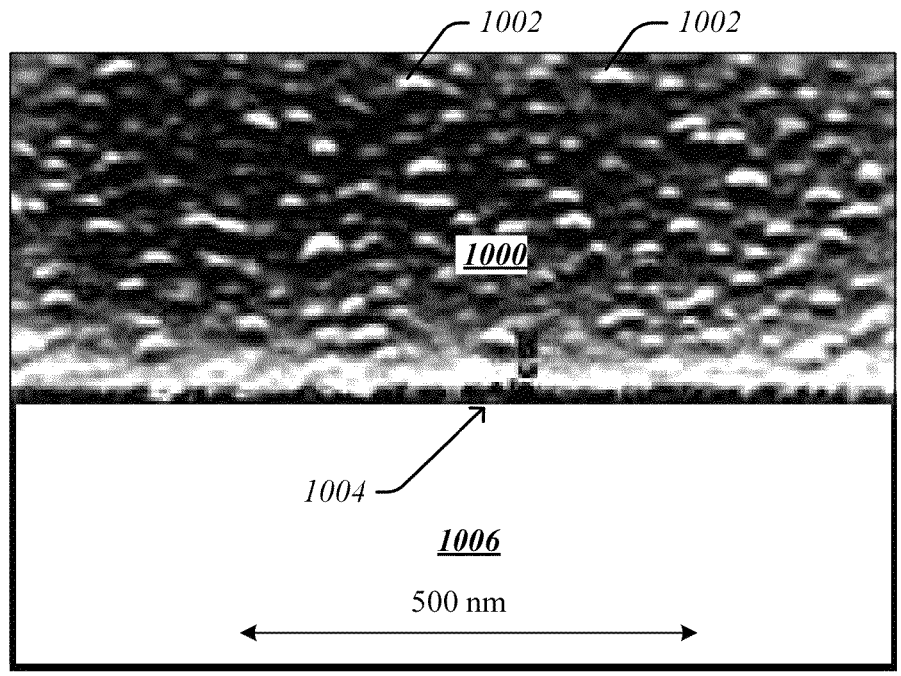
FIGS. 10a and 10b depict porous germanium surface and cross-section film structure for two different deposition conditions consistent with the present embodiments.
Figure 10B:
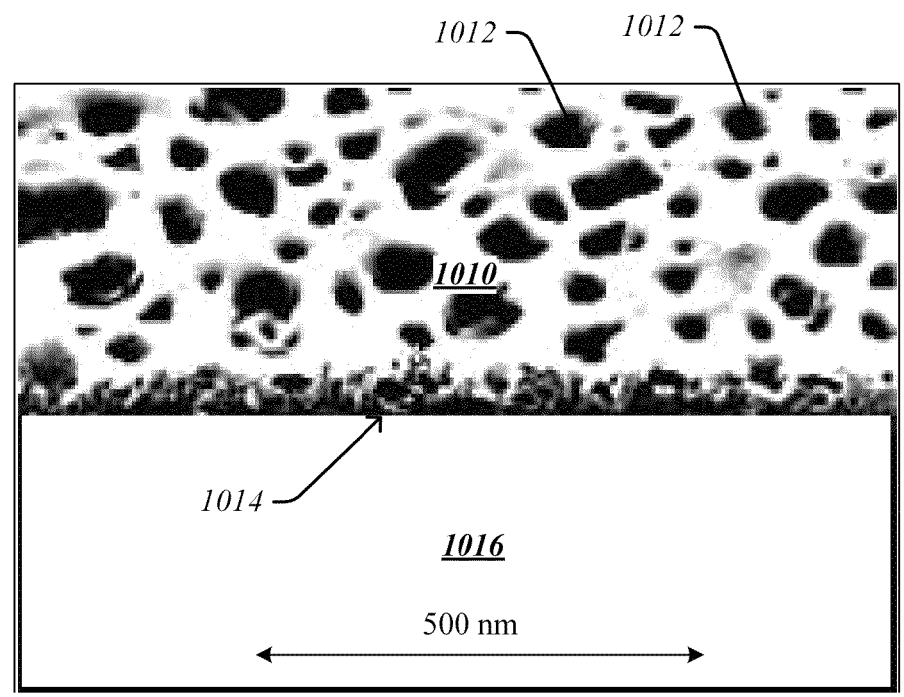

FIGS. 10a and 10b are depictions of P—Ge films based on SEM analysis showing a perspective view that includes a cross-section of deposited P—Ge films. The film 1000 of FIG. 10a is deposited on a substrate 1006 at a relatively lower power (1 kW), lower pressure (5 mTorr), and lower ion energy (1 kV). The film 1010 shown in FIG. 10b is deposited on a substrate 1016 at relatively higher power (5 kW), higher pressure (40 mTorr), and higher ion energy (4 kV). The film 1000 exhibits a moderate degree of surface roughness characterized by small hillocks 1002 many of which are about 20-30 nm diameter, which corresponds to an increased surface area as compared to a flat planar surface. In addition, pores 1004 are visible in the cross-section of the film 1000.

The film 1010 exhibits a much rougher surface that is characterized by deep pits 1012 of varying diameter in the range of about 10 to 100 nm, corresponding to a surface area that is much greater than that of film 1000. In addition, pores 1014 are visible in the cross-section of the film 1000. Accordingly, deposition of a P—Ge film at a relatively higher pressure, higher plasma power, and higher ion energy may be effective in increasing lithium diffusivity in batteries formed by such a process.

In various other embodiments, post-deposition treatment of a porous film may be effective in increasing surface area. For example, it has been observed that as-deposited P—Si films often exhibit a flat surface, meaning that the surface area is relatively low compared to rough surface films. In one embodiment, the surface area of such films may be increased by etching the top surface using ions, such as a low energy argon plasma etch. This etch may remove portions of the deposited P—Si film in the top surface region, exposing some internal pores to the ambient, and thereby creating a larger surface area due to the larger surface area of pores in comparison to the initially planar surface.

In various embodiments, a system such as plasma processing system 100 may include a heater to heat a workpiece, as illustrated by heater 135 in FIG. 4. The heater 135 is depicted as part of platen 134; however, in other embodiments the heater may be external to a substrate platen. The workpiece may be heated during deposition of a porous film in order to further control the structure and properties of the resulting film. For example, if workpieces are unheated, a resulting P—Ge, P—Si, or P—SiGe film may have a non-crystalline structure. If the workpiece is heated during film deposition the resulting porous film may be crystalline. In addition, the level of impurities within the film, such as hydrogen, may be reduced.

In additional embodiments, the workpiece may be treated before deposition of a porous film. For example, a pre-deposition etching process could be performed to prepare a metal surface for deposition of a porous layer. The pre-deposition etch may remove undesirable oxides on the metal surface in order to improve the quality of the porous film/collector interface. In one embodiment where porous films are deposited upon a single crystal silicon surface, removing the undesirable oxide may facilitate the deposition of a single crystalline porous film on the underlying collector. In some embodiments, an in-situ pre-deposition etch may be performed by exposing the nominally metallic surface of the workpiece to ions extracted from a plasma in a processing chamber used to provide the depositing porous film. For example, in an initial procedure, a plasma comprising inert gas ions may be ignited in process chamber 102 to expose the metallic surface of a workpiece 138 to ion bombardment to clean any impurities. This may be done with or without the presence of a plasma sheath modifier 201. Subsequently, precursor ions may be introduced into the processing chamber 102 with the plasma sheath modifier 201 in place to perform deposition of a porous film using ions directed to workpiece 138 over a range of angles.

In additional embodiments, after deposition of a porous film, post-deposition annealing may be performed to crystallize the film or to improve crystallinity of the film. In addition, the post-deposition annealing may be performed to drive out impurities from the film.

In further embodiments, various combinations of the aforementioned pre-deposition treatments, deposition parameters, and post-deposition treatments may be selected to tailor the porous film structure and composition to produce a set of desired film properties, such as an optimal combination of contact resistance, sheet resistance, lithium diffusivity, and stress relief.

Figure 11:
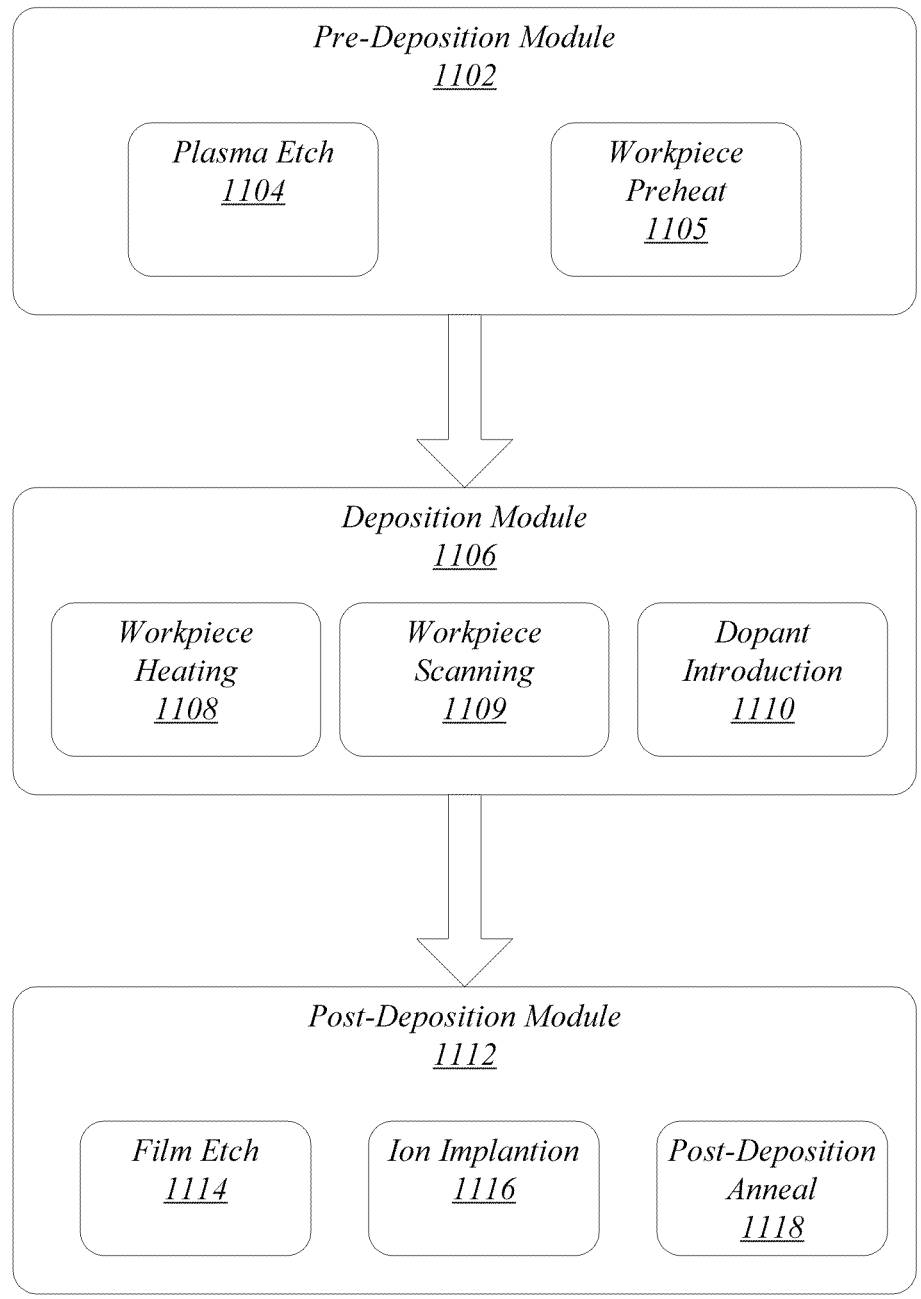
FIG. 11 depicts elements of a processing module consistent with various embodiments.

Consistent with the present embodiments, FIG. 11 illustrates a processing module 1100 from which multiple processing recipes can be constructed for fabricating porous films, such as P—Si, P—Ge, and P—SiGe. Processing module 1100 may be viewed as a module for processing operations that may be performed in addition to basic operations for forming porous films that are described generally with respect to FIGS. 4-7 above. The basic operations may include providing at least one type of precursor ion to a workpiece over multiple angles in order to form a porous film. In processing module 1100, pre-deposition module 1102 is shown as including a plasma etch operation 1104 for performing plasma etching of a workpiece before film deposition. The plasma etch operation 1104 may be employed, for example, to clean the surface of a workpiece, such as a metallic workpiece, before porous film deposition. Depending upon the material to be deposited and the workpiece temperature during porous film deposition, the plasma etch operation 1104 may be effective in inducing subsequent growth of a polycrystalline or single crystalline porous film. The pre-deposition module 1102 further includes a workpiece preheating operation 1105, which may be employed to clean a workpiece similarly to the plasma etch operation 1104. Additionally, the workpiece preheating operation 1105 may be used to bring the workpiece to a desired temperature, which may be the same temperature at which film deposition is to occur.

Deposition module 1106 includes an workpiece heat operation 1108 for heating a workpiece during deposition, a workpiece scanning operation 1109, and an dopant introduction operation 1110 for introducing dopants into a film during film deposition. In various embodiments, one or all of these operations may be selected during the film deposition. For example, workpiece scanning operation 1109 may be selected to scan a workpiece with respect to an aperture of a plasma sheath modifier. Referring again to FIG. 5b, in one example, the workpiece holder 280 may be scanned along the direction 282 with respect to the aperture 231 to expose all areas of the workpiece 138 to ions 202 so that deposition of a porous coating may take place on the entire workpiece 138.

Post-deposition module 1112 includes a film etch operation 1114, which may be employed to increase surface area of a deposited film. As noted above, the film etch operation 1114 may take place by subjecting the deposited film to ion bombardment to remove outer portions of the film thereby exposing internal pores that serve to increase the now exposed surface area. Post-deposition module 1112 also includes an ion implantation operation 1116, which may be employed to alter film conductivity by implanting dopant ions into the deposited film. The post-deposition module 1112 also includes an annealing operation 1118, which may be used to crystallize a deposited film and/or drive out impurities in the deposited film. In various embodiments, any combination of these operations may be performed. In addition, further operations may be included, such as an ion implantation operation to improve adhesion of the porous film to a workpiece, which may employ a different recipe than the ion implantation operation to alter conductivity.

In summary, the present embodiments provide a novel technology for depositing films while simultaneously creating film porosity, a result not readily achieved by other known techniques. In the present embodiments, porous Si, porous Ge, and porous SiGe films can be deposited at room temperature (that is, without heating a workpiece) and with precise control of film porosity and surface area, and with control of doping level and alloy composition of deposited films. In contrast, traditional plasma enhanced chemical vapor deposition (PECVD) methods for depositing films require high temperatures for deposition, and can only create amorphous layers of Si and Ge as deposited, which do not exhibit the porosity afforded by the present embodiments.

Moreover, conventional techniques for creating porous Si, such as anodized etching, are only effective using single crystal wafers, and are not applicable to forming thin films or porous Ge films. This renders fabrication of porous films using conventional techniques both expensive and difficult to scale to commercial size anode production.

In addition, properties and structure of ion-assisted grown porous films formed according to the present embodiments, including the size of the pores, are superior to that of conventional porous silicon formed by anodic etching. In various embodiments, the pore size of ion-assisted films is on the order of about one nanometer to a few tens of nanometers, while conventional anodic etching of silicon to form pores produces pore sizes on the micron scale. An advantage of being able to provide uniformity at such a small length scale (nm) is that a more uniform volumetric expansion upon lithiation may result, together with less stress concentration from cycling of lithium into and out of the anode during charging/discharging cycles of a battery. This may lead to greater structural integrity over repeated cycling of a battery based upon the present porous film materials.

Another advantage afforded by the present embodiments is that porous materials that are non-crystalline may be readily fabricated. It has been demonstrated in the published literature that amorphous (non-crystalline) thin films have less charging capacity fade and increased cycle rate capabilities as compared to crystalline films. The mechanism is believed to be related to improved lithium diffusivity in less atomically dense films, which is typically the case in amorphous films. As detailed above, the apparatus and process recipes employed in the present embodiments readily deposit amorphous porous films, whereas known etching processes used to form porous silicon by nature involve forming pores in single crystal substrates that remain crystalline after etching. Accordingly, such porous silicon is not ideally suited to promote lithium diffusion.

Since the ion-assisted porous film formation processes disclosed herein essentially involve deposition process that may be performed at room temperature, the processes disclosed herein can be performed using virtually any substrate. Moreover, lithium-ion battery anodes require a metal substrate (workpiece) to act as a current collector, and preliminary experimental results indicate similar growth rates are achieved on metal and semiconductor substrates. Thus, porous layers fabricated according to the present embodiments can be easily formed on the desired metal substrate, which facilitates the ability to determine the mass or amount of active anode layer formed. On the other hand, conventional etched porous Si requires the use of a single crystal silicon wafer as a substrate, which not only adds resistance to the resulting device, but also makes measuring the active mass (that is, the etched portion in which the lithium ions may diffuse) difficult.

Finally, there is evidence that ion-assisted deposition creates a more durable bond to the substrate than conventional deposition techniques due to less built-in strain. This may aid in maintaining contact between the semiconductor-porous-film anode and the current collector during repeated cycling.

While the disclosure describes ion-assisted fabrication to create porous Si, SiGe, and Ge semiconductor films, the disclosure is not limited to these embodiments. For example, these methods may be used to fabricate other porous materials, including but not limited to porous carbon, porous GaN, porous Zn, and porous ZnTe. By changing the reaction gas, any of these materials can be deposited to become a porous material. In addition, although the disclosure describes the use of plasma based apparatus in conjunction with a plasma sheath modifier to provide an angular range of depositing ions, other processes may also be used. Any focused ion beam or another plasma tool that modifies the plasma sheath may be used to perform these methods. Additionally, any convenient gaseous precursor for silicon or germanium may be used for deposition of porous films, including those containing halogens, halogen and hydrogen, and so forth.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of producing a porous semiconductor film on a workpiece, comprising:
   generating semiconductor precursor ions comprising one or more of germanium precursor ions and silicon precursor ions in a plasma of a plasma chamber, the semiconductor precursor ions operative to form a porous film on the workpiece; and
   directing the semiconductor precursor ions to the workpiece over a range of angles, wherein the directing the semiconductor precursor ions comprises:
   providing a plasma sheath modifier that defines an aperture located between the plasma and workpiece; and
   attracting the semiconductor precursor ions to the workpiece through the aperture.

2. The method of claim 1, further comprising providing to the plasma chamber:
   a reactive gas mixture that contains germanium and silicon; and
   a dilutant gas.

3. The method of claim 2, wherein the dilutant gas comprises one or more of hydrogen, nitrogen, helium, neon, argon, krypton, and xenon.

4. The method of claim 1, further comprising providing a flow of dopant gas to the plasma chamber during the directing the semiconductor precursor ions.

5. The method of claim 4, the providing the flow of dopant gas comprising:
introducing the dopant gas at a first flow rate during a first period of growing the porous semiconductor film; and
reducing the flow rate of dopant gas from the first flow rate during a subsequent period of growing the porous semiconductor film.

6. The method of claim 1, wherein the attracting the semiconductor precursor ions to the workpiece through the aperture comprises a growth period of the porous semiconductor film, the method further comprising implanting dopant species into the porous semiconductor film after the growth period.

7. The method of claim 1, further comprising exposing the workpiece to a plasma etch before the generating the semiconductor precursor ions.

8. The method of claim 1, further comprising heating the workpiece during the directing the semiconductor precursor ions to the workpiece.

9. The method of claim 1, wherein the attracting the semiconductor precursor ions to the workpiece through the aperture comprises a growth period of the porous semiconductor film, the method further comprising etching an outer surface of the porous semiconductor film after the growth period.

10. The method of claim 1, the generating the semiconductor precursor ions comprising:
providing a reactive silicon containing gas and reactive germanium containing gas to the plasma chamber; and
providing an RF power to the plasma between one and twenty kW.

11. The method of claim 4, wherein the attracting the semiconductor precursor ions to the workpiece through the aperture comprises:
directing for a first duration, the semiconductor precursor ions through the aperture over a first range of incident angles upon the workpiece while the aperture is arranged at a first width; and
directing for a second duration the semiconductor precursor ions through the aperture over a second range of incident angles upon the workpiece while the aperture is arranged at a second width different than the first width.

12. The method of claim 3, the attracting the semiconductor precursor ions to the workpiece through the aperture:
providing to the plasma chamber a first dilutant gas over a first period; and
providing to the plasma chamber a second dilutant gas over a second period subsequent to the first period, the second dilutant gas comprising a higher average atomic weight than the first dilutant gas.

13. The method of claim 1, further comprising scanning the workpiece with respect to the aperture during the directing the semiconductor precursor ions.

\* \* \* \* \*